United States Patent [19]
Murakami et al.

[11] Patent Number: 5,053,844
[45] Date of Patent: Oct. 1, 1991

[54] AMORPHOUS SILICON PHOTOSENSOR

[75] Inventors: Akishige Murakami, Shibata; Hiroshi Miura, Natori; Kouichi Haga, Shibata; Kenji Yamamoto, Watari; Masafumi Kumano, Sendai, all of Japan

[73] Assignees: Ricoh Company, Ltd., Tokyo; Ricoh Research Institute of General Electronics Co., Ltd., Natori, both of Japan

[21] Appl. No.: 609,107

[22] Filed: Nov. 1, 1990

Related U.S. Application Data

[63] Continuation-in-part of Ser. No. 350,852, May 12, 1989, abandoned.

[30] Foreign Application Priority Data

May 13, 1988 [JP] Japan .............................. 63-116684

[51] Int. Cl.$^5$ ...................... H01L 27/14; H01L 31/00
[52] U.S. Cl. .......................................... 357/30; 357/2; 357/58; 357/17
[58] Field of Search ....................... 357/17, 58, 2, 30

[56] References Cited

U.S. PATENT DOCUMENTS

| | | | |
|---|---|---|---|
| 4,388,482 | 6/1983 | Hamakawa et al. ................ | 136/258 |
| 4,476,346 | 10/1984 | Tawada et al. ..................... | 136/249 |
| 4,612,559 | 9/1986 | Hitotseyanagi et al. ............. | 357/2 |
| 4,775,425 | 10/1988 | Guha et al. ......................... | 139/249 |
| 4,782,376 | 11/1988 | Catalano ............................. | 357/30 |

Primary Examiner—Andrew J. James
Assistant Examiner—Donald L. Monin, Jr.
Attorney, Agent, or Firm—Oblon, Spivak, McClelland, Maier & Neustadt

[57] ABSTRACT

An amorphous silicon photosensor is disclosed, which comprises a photoconductive layer which comprises three or four amorphous silicon layers formed on a substrate, each layer containing at least one kind of atom selected from the group consisting of hydrogen, heavy hydrogen, and halogen atoms, and having two heterojunctions, in which the optical band gap of an amorphous silicon layer lying between the two heterojunctions is in the range of 1.6 to 1.8 eV, a first end amorphous silicon layer, to which light is applied, contains oxygen, has an optical band gap of 1.9 eV or more, and at least part of the layer indicates an i-type or p-type conductivity, and a second end amorphous silicon layer, to which light is not applied, contains oxygen, having an optical band gap of 1.9 eV or more, and at least part of the layer indicates an i-type or n-type conductivity.

9 Claims, 6 Drawing Sheets

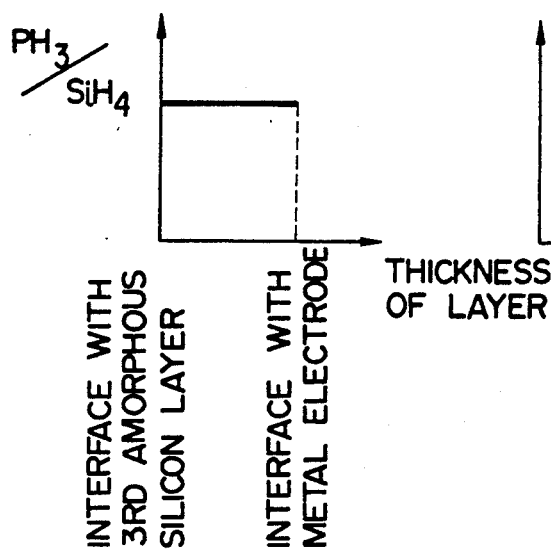
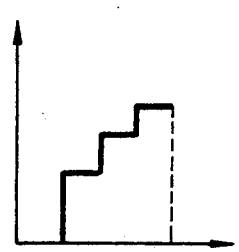
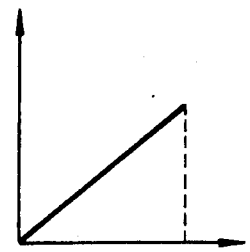
FIG.5(a) CONSTANT
FIG.5(b) STEPWISE
FIG.5(c) CONTINUOUS
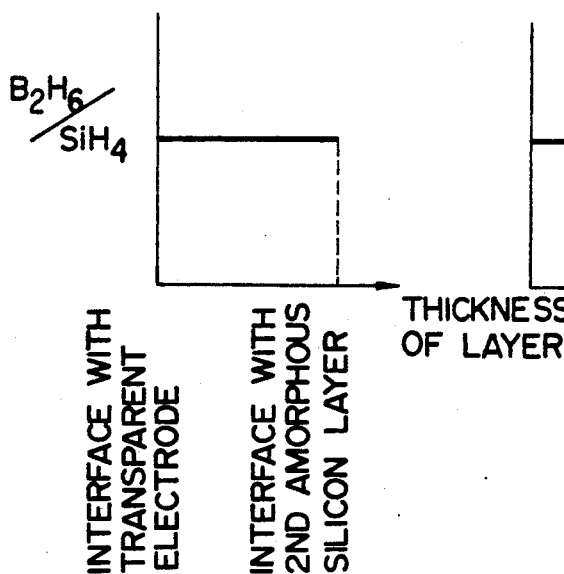
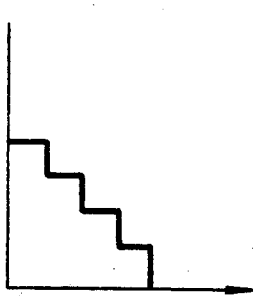
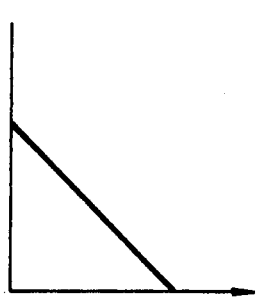
FIG.6(a) CONSTANT
FIG.6(b) STEPWISE
FIG.6(c) CONTINUOUS

AMORPHOUS SILICON PHOTOSENSOR

BACKGROUND OF THE INVENTION

This application is a continuation-in-part of application Ser. No. 350,852 filed on May 12, 1989, now abandoned.

1. Field of the Invention

This invention relates to an amorphous silicon photosensor comprising a photoconductive layer which comprises 3 or 4 amorphous silicon layers, having two heterojunctions, each amorphous silicon layer containing at least one kind of atom selected from the group consisting of hydrogen, heavy hydrogen and halogen atoms.

2. Discussion of Background

In order to inexpensively produce an amorphous silicon photosensor having high resolution, it is necessary to make the photosensor thin, and as simply-structured as possible.

There are three types of amorphous silicon photosensors, depending on their structure, which are now in general use, as shown in FIGS. 2(a), 2(b) and 2(c).

FIG. 2(a) is a schematic cross-sectional view of one of the three types, known as a pin-type photosensor. This type of photosensor has a high Ip/Id ratio because both a p-layer 201 and an n-layer 202 shown in the figure are capable of serving as barriers for preventing the injection of carriers. An i-layer 203, formed between the p-layer 201 and the n-layer 202, can have a thickness ranging from 0.5 to 1.0 μm, which is sufficient for the photosensor; thus the photosensor can be made thin.

However, since the electric conductivities of p-type and n-type amorphous silicon layers are high ($\sigma = 10^{-3} - 10^{-4}$ v.cm$^{-1}$), the series resistances of these two layers are not negligible in the pin-type photosensor. It is, therefore, necessary to separate these two layers, and, as a result, the manufacturing process of the photosensor becomes complicated. The p- and n-layers are doped with impurities of atoms belonging to the III and V groups, and these atoms gradually diffuse into the i-layer, inducing a decrease in the Ip/Id ratio. Furthermore, the p- and n-layers are extremely thin (in general 100 Å or less), so that pin holes are easily made on these layers by dusts and similar particles, and it is quite hard to obtain uniformity in the layers.

FIG. 2 (b) shows an MIS-type photosensor in which an insulating layer 201 of, for instance, SiO$_2$ or Si$_3$N$_4$, is employed as a block layer. This type of photosensor is stable for a longer period than the pin-type photosensor, because no pn control is performed in the MIS-type photosensor. When the insulating layer 204 is thick, the Ip decreases, so that the insulating layer 204 is required to have a thickness of 100 Å or less. However, such a thin insulating layer cannot be uniformly prepared by a plasma chemical vapor deposition method or sputtering. Furthermore, pinholes are easily made in the thin insulting layer, and it has a low production yield.

In order to overcome the above shortcomings, the photosensor shown in FIG. 2 (c) has been proposed, in which a photoconductive layer 205 having a wide band gap is employed as a block layer to protect the injection of carriers. A photosensitive amorphous silicon layer doped with carbon or oxygen is commonly used as the photoconductive layer. The photoconductive layer with a wide band gap serves as a barrier to the injection of carriers in the dark. This layer, however, has almost an equal level of conductivity ($\sigma$ph = $10^{-6} - 10^{-10}$ v.cm$^{-1}$) to the a-Si:H layer, upon application of light, which causes photocarriers generated in the layer to move easily. when the thickness of the photoconductive layer 205 is increased to about 750 Å. Unlike the pin-type and MIS-type photosensors, this type of photosensor does not contain extremely thin layers, so that a uniformly-structured photosensor can be produced at a high yield. Furthermore, since the photosensor contains the photoconductive layer having a wide band gap, it has a high sensitivity to the light of short wavelengths when compared with the pin-type and MIS-type photosensors. Such a property is also applicable to a color-sensitive photosensor.

One drawback to this photosensor having a photoconductive layer with a wide band gap is that its photoconductive layer serves as a barrier to the electrons injected to the photosensor, and only the a-Si:H layer acts as a barrier to holes, so that the height of the barrier is insufficient, resulting in an increase in the Id value, which becomes higher than that of the pin-type photosensor. Furthermore, since "punch through" is apt to occur in the photosensor with this structure, it will be necessary that the a-Si:H layer have a thickness ranging from 1.5 to 2.0 μm. When the layer is thinner than this range, the Id increases remarkably as shown in the graph in FIG. 3, and such an increase brings about a fall in the Ip/Id ratio. The a-Si:H layer is formed at a rate of only about 2 to 4 Å/sec when a plasma CVD method is employed, so that it takes several hours to form an a-Si:H layer of 1.5 to 2.0 μm in thickness. Therefore it is not easy to effectively mass-produce an a-Si:H layer.

In FIGS. 2 (a), (b) and (c), reference numeral 206 indicates a substrate; reference numeral 207, a lower electrode; reference numeral 208, a transparent electrode; and reference numeral 209, an a-Si:H layer.

The graph in FIG. 3 shows the relationships between the thickness of the a-Si:H layer and the Ip, and between the thickness of the a-Si:H layer and the Id of the photosensor shown in FIG. 2 (c).

SUMMARY OF THE INVENTION

Accordingly, it is an object of the present invention to provide an amorphous silicon photosensor comprising thin amorphous silicon layers, which has a high Ip/Id ratio, is uniform in structure, and applicable to color-sensing.

This object of the present invention can be achieved by an amorphous silicon photosensor comprising a photoconductive layer which comprises three or four amorphous silicon layers, each layer containing at least one kind of atom selected from the group consisting of hydrogen, heavy hydrogen, and halogen atoms, and having two heterojunctions, in which the optical band gap of an amorphous silicon layer lying between the two heterojunctions is in the range of 1.6 to 1.8 eV, an end amorphous silicon layer, to which light is L- applied, contains oxygen, has an optical band gap of 1.9 eV or more, and at least part of the layer indicates an i-type or p-type conductivity, and an end amorphous silicon layer, to which light is not applied, contains oxygen, having an optical band gap of 1.9 eV or more, and at least part of the layer indicates an i-type or n-type conductivity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 5 (a), 5(b) and 5(c) are charts showing doping profiles of $PH_3$ in a third amorphous silicon layer of the photosensor according to the present invention;

FIGS. 6 (a), 6(b) and 6(c) are charts showing doping profiles of $B_2H_6$ in a p-type amorphous silicon layer having a wide band gap;

DESCRIPTION OF THE PREFERRED EMBODIMENTS

Figure 4:
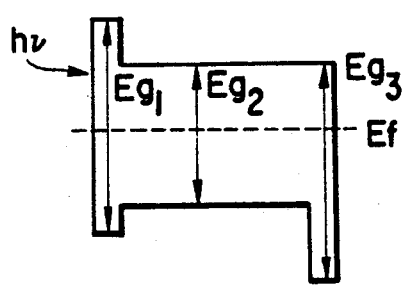
FIGS. 4 (a), 4(b), 4(c) and 4(d) are diagrams showing energy band models of the photosensors according to the present invention.
Figure 4:
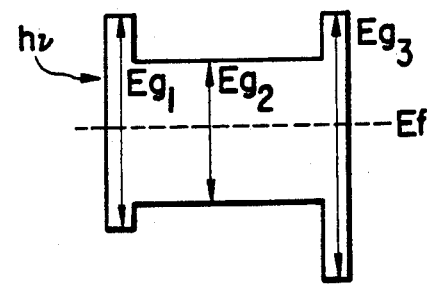
Figure 4:
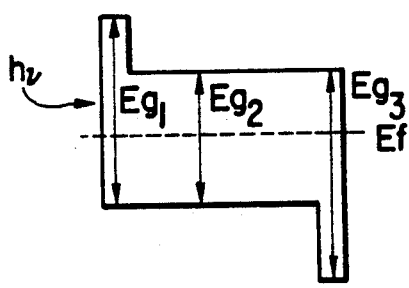
Figure 4:
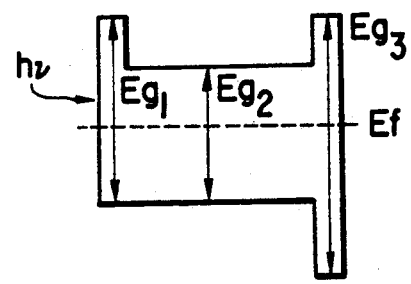

The diagrams shown in FIGS. 4 (a) to 4(d) are energy band models of the photosensors according to the present invention. Each photosensor consists of three amorphous silicon layers which have optical band gaps of Eg 1, Eg2 and Eg 3, respectively, arranged from the light-incident side. There are two heterojunctions between the layers having band gaps Eg1 and Eg2, and between the layers having band gaps Eg2 and Eg3.

The photosensors according to the present invention are characterized by an optical band gap Eg2, of an amorphous silicon layer lying between the above two heterojunctions, which is narrower than the optical band gaps Eg1 and Eg3 of the opposite end amorphous silicon layers. The optical band gap Eg2 is in the range of 1.6 to 1.8 eV, and optical band gaps Eg1 and Eg3 are each 1.9 eV or more. The opposite end amorphous silicon layers contain oxygen.

At least some part of one end amorphous silicon layer to which light is applied, is of an i-type or p-type conductivity, and at least some part of the other end amorphous silicon layer to which light is not applied, is of an i-type or n-type conductivity.

In the present invention, as the i-type amorphous silicon layer, not only an intrinsic semiconductor but also a conductivity type semiconductor which is not intentionally subjected to PN control can be employed.

The photosensor having the above structure has the following advantages.

The two amorphous silicon layers which form a heterojunction Eg1 and Eg2 constitute a photo-carrier generating layer near the light-incident side upon application of light thereto. The silicon layer having band gap Eg2 has a spectroscopic sensitivity pattern which is almost equal to the photosensitive layers in the pin-type and MIS-type photosensors. Since the spectroscopic sensitivity of the amorphous silicon layer having band gap Eg1 is shifted to a region of short wavelengths, the entire spectroscopic sensitivity of the photosensor is sensitized by light having short wavelengths. Such a property is advantageous for color-sensing.

Since the amorphous silicon layers at both ends of the photosensor have wide band gaps, they serve as good barriers to electrons and holes, and low Id can thus be attained. Furthermore, when a p-type amorphous silicon layer having a wide band gap is formed on the external side of the amorphous silicon layer having band gap Eg1, the barrier to electrons becomes higher, and lower Id can be attained. Thus, such a structure, is very desirable.

The amorphous silicon layer having band gap Eg3, which forms a heterojunction on the side where light is not applied, has a high resistance, so that an electric field is concentrated in this layer. Because of this, an electric field does not concentrate in the amorphous silicon layer lying between two heterojunctions, and the spread of a depletion layer is restricted. As a result, "punch through" hardly takes place in the photosensor as a whole, so that low Id can be achieved. Furthermore, the thickness of the amorphous silicon layer lying between the two heterojunctions can be minimized to the extent sufficient for light-absorption, which is, in general, a thickness of 1 μm or less when calculated from the absorption coefficient of a non-doped amorphous silicon layer.

When a thin metal layer is used as an electrode on the back side of the silicon layer having wide band gap Eg3, light which is not absorbed by the photocarrier-generating amorphous silicon layers is reflected back by the metal layer, so that the photosensor can be made thinner as a whole.

As described above, a photosensor which is thinner than conventional ones, has high Ip/Id, and is usable as a color sensor can be attained by the structure according to the present invention.

Explanations on each layer of the photosensor according to the present invention are given below.

Figure 1A:
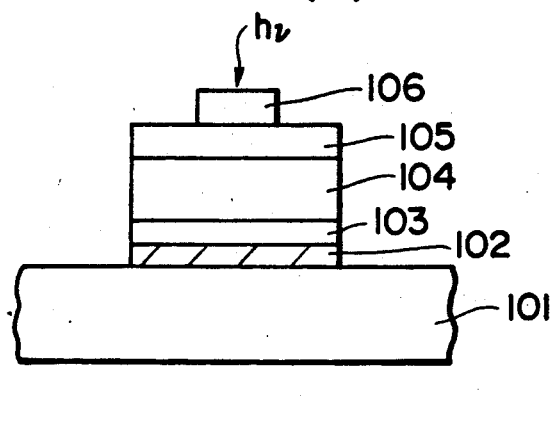
FIGS. 1 (a) and 1(b) are schematic cross-sectional views of the photosensors according to the present invention.
Figure 1B:
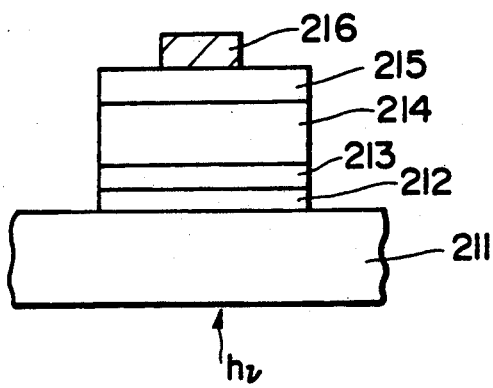
Figure 2A:
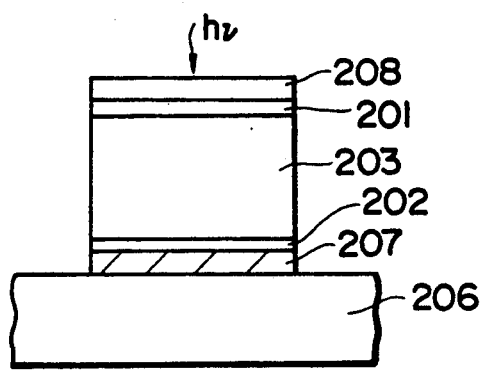
FIGS. 2 (a), 2(b) and 2(c) are schematic cross-sectional views of conventional photosensors.
Figure 2B:
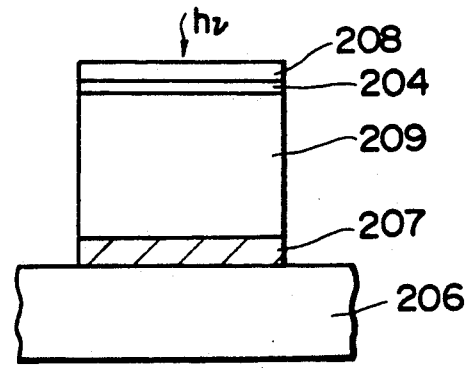
Figure 2C:
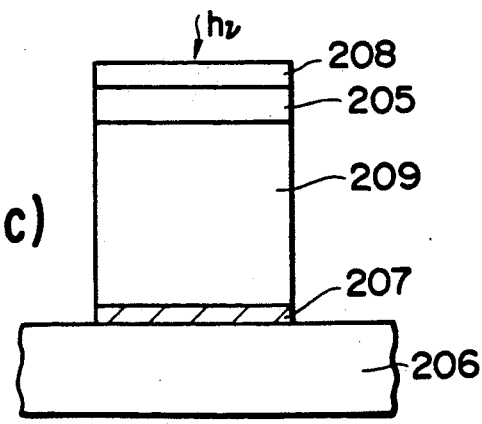
Figure 3:
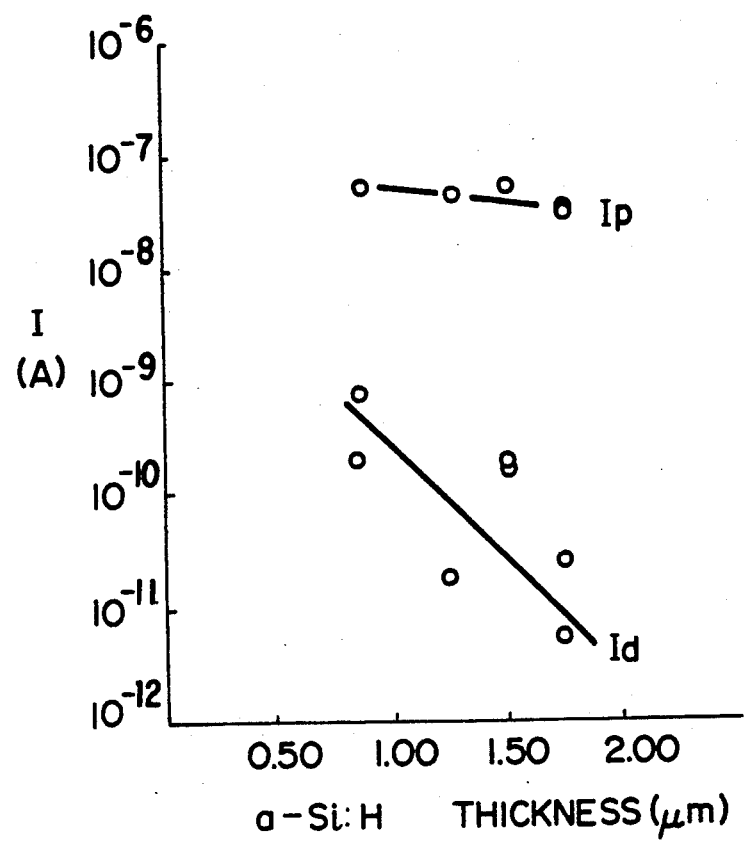
FIG. 3 is a graph showing the relationships between the thickness of the a-Si:H layer and the Ip, and between the thickness of the a-Si:H layer and the Id of the conventional photosensor element shown in FIG. 2 (c)

The structure of the photosensors of the present invention is shown in FIGS. 1(a) and 1(b). FIG. 1 (a) is a cross-sectional view of a photosensor of the type comprising a transparent upper electrode to which light is applied; and FIG. 1 (b) is a cross-sectional view of a photosensor of the type comprising a transparent electrode formed on a transparent substrate to which light is applied.

A substrate 101 in the photosensor of the type shown in FIG. 1(a) is made of an inorganic transparent, insulating material such as ceramic, or a transparent polymer resin such as polyethylene, polypropyrene or vinylchloride. In addition to the above, an electroconductive metal plate of Al, Cr, Mo or Fe can be employed to serve both as a substrate and a lower electrode.

A lower electrode (metal electrode) 102 is prepared by forming a thin metal layer of Cr, Mo, Ni, Pt or Au on the substrate 101 by means of vacuum deposition or sputtering. It is preferable that the lower electrode have a thickness of 500 Å to 1,500 Å for effective reflection of incident light.

A photoconductive layer consisting of three amorphous silicon layers is formed on the lower electrode 102.

A third amorphous silicon layer 103 has an optical band gap of Eg3, a second amorphous silicon layer 104 has an optical band gap of Eg2, and a first amorphous silicon layer 105 has an optical band gap of Eg1.

The third amorphous silicon layer 103 is formed on the lower electrode 102 by a plasma CVD method using a SiH$_4$ gas or a gas mixture of polysilane and CO$_2$ or N$_2$O. The above gases may be diluted with H$_2$, N$_2$, Ar or He, if necessary. When SiH$_4$ gas is employed, an a-Si:O:H layer is formed as the third amorphous silicon layer.

Alternative materials which can be used as the third amorphous silicon layer include: an a-Si:O:F layer prepared by using a halogenated compound such as SiF$_4$ together with CO$_2$ or N$_2$O gas; and an a-Si:O:D layer prepared by using a heavy hydrogen compound such as SiD$_4$ together with CO$_2$ or N$_2$O gas.

When the third amorphous silicon layer 103 is prepared by a plasma CVD method using SiH$_4$ gas and CO$_2$ gas, a wide band gap layer capable of sufficiently preventing the injection of holes can be obtained by controlling the CO$_2$/SiH$_4$ ratio to 1 to 50, preferably 10 to 50 for not decreasing the Ip. Thus, optical band gap Eg3 can be made 1.9 eV or more.

In general, a pn-controlled amorphous silicon layer prepared by a glow discharge indicates n$^-$-type conductivity. In the present invention, both intrinsic conductivity and pn-uncontrolled conductivity are acceptable as the i-type conductivity.

When the third amorphous silicon layer is prepared, n-type impurities such as PH$_3$ can be doped to form an a-Si:O:H layer. When the layer is made an n-type amorphous silicon layer, the barrier to holes becomes higher, and the Id becomes lower. In order to maintain the characteristics of a highly resistant layer, a preferable PH$_3$/SiH$_4$ ratio is less than $10^{-3}$. As shown in the doping profiles in FIG. 5, PH$_3$ may be introduced into the third amorphous silicon layer (a) homogeneously in constant concentration, (b) in concentration increasing stepwise towards the lower metal) electrode, or (c) in concentration continuously and linearly increasing towards the lower (metal) electrode. When the layer is doped with PH$_3$ in the above manner of (b) or (c), an a-Si:O:H layer, free from atoms belonging to the V group, is formed on the surface of the third amorphous silicon layer, which will be an interface between the third and the second amorphous silicon layers, and protects the second amorphous silicon layer from diffusion of the V group atom.

It is preferable that the conductivity of the third amorphous silicon layer 103 be adjusted to $\sigma d \leq 10^{-11} v.cm^{-1}$ so as to impart a high resistance to the layer and in order to form a thin photosensor. The thickness of the layer is in the range of 100 to 1,000 Å, preferably 100 to 500 Å, and more preferably 100 to 200 Å.

The second amorphous silicon layer 104 is formed on the third silicon layer 103, by a plasma CVD method using gas of SiH$_4$, SiF$_4$, SiD$_3$ or a high molecular compound thereof. The above gas can be diluted with H$_2$, Ar or He, if necessary.

Although a non-doped second amorphous silicon layer is of an n$^-$-type, an amorphous silicon layer of an i- or p$^-$-type, which is doped with an extremely small amount of atoms belonging to the III group, can also be employed as the second amorphous silicon layer as far as the optical band gap Eg2 is in the range of 1.6 to 1.8 eV.

The second amorphous silicon layer 104 is a photocarrier-generating layer, so that it should have a high $\sigma ph/\sigma d$ ratio. The oph means a conductivity when pseudo sun light AM-1 is irradiated to the layer with an irradiation power of 100 mW/cm$^2$. A preferable range of the $\sigma ph/\sigma d$ ratio is $10^3$ to $10^6$, more preferably $10^4$ to $10^5$ at 20° C.

All conductivity and AM-1 conductivity values reported in this application are values obtained at, and reported for, 20° C.

A preferable thickness of the second amorphous silicon layer is in the range of 0.3 to 1.0 μm in order to use light The first amorphous silicon layer 105 is formed on the second amorphous silicon layer 104, by a plasma CVD method using SiH$_4$ gas or a gas mixture of polysilane and CO$_2$ or N$_2$O gas. Instead of the SiH$_4$ gas, halogenated gas such as SiF$_4$ or heavy hydrogen gas such as SiD$_4$ can also be employed. The above gases can be diluted with H$_2$, N$_2$, Ar and He, if necessary.

In the case where the first amorphous silicon layer is prepared by using SiH$_4$ gas and CO$_2$ gas, a preferable SiH$_4$/CO$_2$ ratio is in the range of 1 to 50, more preferably 2 to 10. The layer prepared under such conditions has an optical band gap (Eg1) of 1.9 eV or more, and has high sensitivity to light having short wavelengths.

When the $\sigma ph/\sigma d$ ratio of the first amorphous silicon layer is not high, the layer cannot have sensitivity to light having short wavelengths. A preferable range of the $\sigma ph/\sigma d$ ratio is $10^3$ 3 to $10^6$, and more preferably $10^4$ to $10^5$.

Although a pn-uncontrolled amorphous silicon layer, that is, an n$^-$-type layer, can be used as the first amorphous silicon layer, it is better to employ an i- or p-type layer doped with p-type impurities in order to obtain a high $\sigma ph/\sigma d$ ratio. The i- and p-type layers have higher barriers to electrons than the n$^-$-type layer, so that a lower Id can be attained. The p-type impurities are doped in such an amount that the $\sigma ph/\sigma d$ ratio becomes $10^3$ or more.

As long as the first amorphous silicon layer satisfies the above conditions, the layer has high resistance in the range of $\sigma d \leq 10^{-11} v.cm^{-1}$ irrespective of its type.

A preferable thickness of the first amorphous silicon layer 105 is in the range of 100 to 1,000 Å, more preferably 200 to 500 Å, when the Id and the uniformity of the layer are taken into consideration.

In order to obtain lower Id, the following manner is more effective than to employ the first amorphous silicon layer doped with p-type impurities.

Namely, a p-type amorphous silicon layer having a wide band gap may be formed between the first amorphous silicon layer 105 and a transparent electrode to provide a higher barrier to electrons. The p-type amorphous silicon layer having a wide band gap is prepared by a plasma CVD method using SiH$_4$ gas or a gas mixture of polysilane, CO$_2$ or N$_2$O gas, and impurities belonging to the III group such as B$_2$H$_6$. Instead of the SiH$_4$ gas, a halogenated compound gas such as SiF$_4$ or heavy hydrogen compound such as SiD$_4$, can be employed.

The first amorphous silicon layer can also be doped, in a solid phase, with atoms belonging to the III group which are contained in the transparent electrode, for instance, In atoms in ITO, so as to make an interface between the silicon layer and the electrode a p-type.

When the p-type amorphous silicon layer having a wide band gap is prepared by using SiH$_4$, CO$_2$ and B$_2$H$_6$, a preferable ratio of CO$_2$/SiH$_4$ is in the range of 1 to 30, preferably 2 to 10. In addition, it is preferable that the CO$_2$/SiH$_4$ ratio of the p-type amorphous silicon layer be higher than that of the first amorphous silicon layer. Such a $CO_2/SiH_4$ ratio improves the window effect of the p-type amorphous silicon layer.

With respect to the $B_2H_6/SiH_4$ ratio, a preferable range is $1 \times 10^{-4}$ to $1 \times 10^{-2}$, more preferably $5 \times 10^{-4}$ to $5 \times 10^{-3}$. Since the p-type amorphous silicon layer doped with $B_2H_6$ under such conditions is a good barrier to electrons, lower Id can be attained.

$B_2H_6$-doping profiles in the p-type amorphous silicon layer having a wind band gap are shown in FIG. 6. The $B_2H_6$ may be introduced into the layer (a) homogeneously in constant concentration, (b) in concentration decreasing stepwise towards the second amorphous silicon layer, or (c) in concentration continuously and linearly decreasing towards the second amorphous silicon layer. When the layer is doped with $B_2H_6$ in the above manner of (b) or (c), an interfacial energy level between the first and the p-type amorphous silicon layers can be depressed when these two layers are joined with each other.

After forming the photoconductive layer consisting of the above three amorphous silicon layers, a transparent electrode 106 made of ITO or $SnO_2$ is formed thereon by means of vacuum evaporation using electron beams or sputtering. A preferable thickness of the electrode is in the range of 500 to 1,500 Å.

In order to efficiently utilize light applied, a light-reflection-protection layer can be formed on the transparent electrode.

A photoconductive layer comprising four amorphous silicon layers can also be employed in the photosensor according to the present invention.

In the photosensor shown in FIG. 1 (b), a transparent substrate 211 is prepared by using an inorganic transparent, insulating material such as glass or quartz, or a transparent polymer resin such as polyethylene, polypropyrene or vinyl chloride.

On the transparent substrate 211, a transparent electrode 212 made of ITO or $SnO_2$ is formed, which is prepared by means of vacuum evaporation using electron beams or sputtering. A preferable thickness of the electrode is in the range of 500 to 1,500 Å.

A first amorphous silicon layer 213 having optical band gap Eg1, a second amorphous silicon layer 214 having optical band gap Eg2, and a third amorphous silicon layer 215 having optical band gap Eg3 are successively overlaid on the transparent electrode 212 to form a photoconductive layer. Each layer is identical to the corresponding amorphous silicon layer of the photoconductive layer shown in FIG. 1 (a).

The advantages of the photosensor of this type are as follows. When the transparent electrode and the first amorphous silicon layer are prepared by using ITO, and $SiH_4$ and $CO_2$, respectively, In atoms contained in the ITO layer diffuses into the first amorphous silicon layer, a-Si:O:H, by plasma damage caused when the silicon layer is formed, and a p+a-Si:O:H layer is formed on the interface between the ITO layer and the a-Si:O:H layer. Thus, a p-type layer having a wide band gap is formed on the interface between the transparent electrode 212 and the first amorphous silicon layer 213.

Finally, an upper electrode (metal) 216 is formed on the amorphous silicon layer 215. The upper electrode is a metal thin layer made of Al, Cr, Pd, Pu or Au, which is prepared by means of vacuum evaporation or sputtering. In order to prevent the passing of light, the electrode is required to have a thickness in the range of 500 to 1,500 Å.

Other features of this invention will become apparent in the course of the following description of exemplary embodiments, which are given for illustration of the invention and are not intended to be limiting thereof.

EXAMPLE 1

Figure 7:
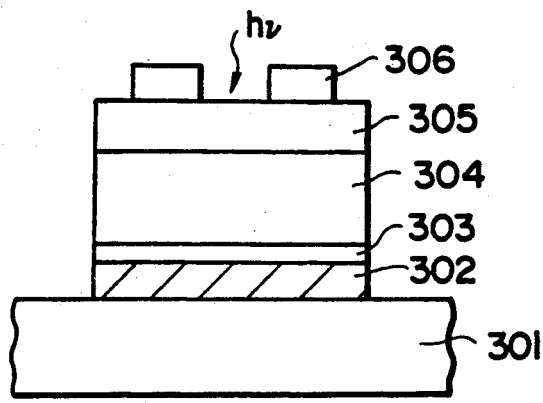
FIGS. 7 to 13 are schematic cross-sectional views of other examples of the photosensor according to the present invention.

A cross-sectional view of the photosensor element according to the present invention prepared in the following manner is shown in FIG. 7.

A Cr thin layer 302 of 1,000 Å in thickness was formed on a substrate 301 made of Pyrex by vacuum evaporation. Thereafter, three amorphous silicon layers were successively overlaid on the Cr layer by a plasma CVD method under the following conditions.

a-Si:O:H layer 303
 Gas flow rate ratios: $SiH_4/H_2=0.2$, $CO_2/SiH_4=25$
 Temperature of the substrate: 250° C.
 Vacuum degree: 1.0 Torr
 RF electric power: 8 W
 Thickness of the layer: 150 Å a-Si:H layer 304
 Gas flow rate ratio: $SiH_4/H_2=0.2$
 Temperature of the substrate: 250° C.
 Vacuum degree: 1.0 Torr
 RF electric power: 20 W
 Thickness of the layer: 0.50 μm a-Si:O:H layer 305
 Gas flow rate ratios: $SiH_4/H_2=0.2$, $CO_2/SiH_4=5$.
 Temperature of the substrate 250° C.
 Vacuum degree: 1.0 Torr
 RF electric power: 8 W
 Thickness of the layer: 500 Å

A $SnO_2$ layer 306 having an area of 2 mm² and a thickness of 750 Å was formed on the amorphous silicon layer 305 by vacuum evaporation using electron beams ($O_2$ gas introduced), whereby a photosensor No. 1 according to the present invention was prepared.

EXAMPLE 2

Figure 8:
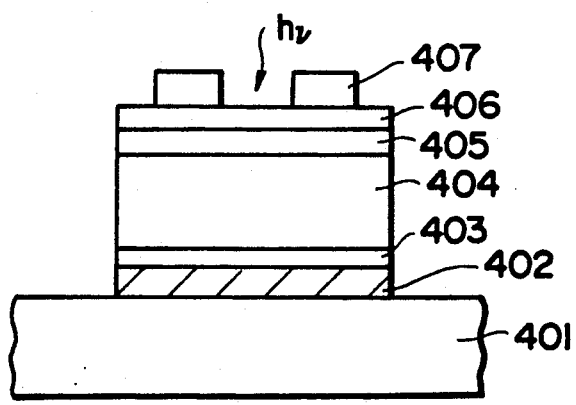

A cross-sectional view of the photosensor element according to the present invention prepared in the following manner is shown in FIG. 8.

A Cr thin layer 402 of 1,000 Å in thickness was formed on a substrate 401 of a quartz plate by DC magnetron sputtering. Thereafter, four amorphous silicon layers were successively overlaid on the Cr layer by a plasma CVD method under the following conditions.

a-Si:O:F layer 403
 Gas flow rate ratios: $SiF_4/Ar=0.1$, $CO_2/SiF_4=25$
 Temperature of the substrate: 250° C.
 Vacuum degree: 1.0 Torr
 RF electric power: 10 W
 Thickness of the layer: 150 Å a-Si:F layer 404
 Gas flow rate ratio: $SiF_4/Ar=0.1$
 Temperature of the substrate: 250° C.
 Vacuum degree: 1.0 Torr
 RF electric power: 25 W
 Thickness of the layer: 0.80 μm a-Si:O:F layer 405
 Gas flow rate ratios: $SiF_4/Ar=0.1$, $CO_2/SiF_4=5$
 Temperature of the substrate: 250° C.
 Vacuum degree: 1.0 Torr
 RF electric power: 10 W
 Thickness of the layer: 500 Å p+a-Si:O:F layer 406 Gas flow rate ratios: $SiF_4/Ar=0.1$ $CO_2/SiF_4=5$ $B_2F_6/SiF_4=5 \times 10^{-3}$
 Temperature of the substrate: 250° C.

Vacuum degree: 1.0 Torr
RF electric power: 10 W
Thickness of the layer: 200 Å

An ITO layer 407 having an area of 2 mm² and a thickness of 750 Å was formed on the amorphous silicon layer by DC magnetron sputtering, whereby a photosensor No. 2 according to the present invention was prepared.

EXAMPLE 3

Figure 9:
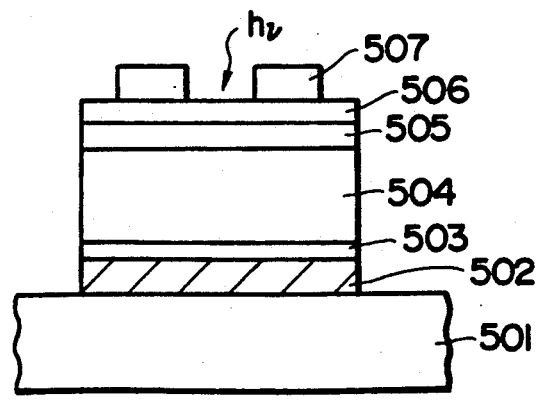

A cross-sectional view of the photosensor element according to the present invention prepared in the following manner is shown in FIG. 9.

A Ni-Cr alloy layer 502 of 1,000 Å in thickness was formed on a substrate 501 of a polyimide film by vacuum evaporation. Thereafter, four amorphous silicon layers were successively overlaid on the substrate by a plasma CVD method under the following conditions.

a-Si:O:D layer 503
  Gas flow rate ratios: $SiD_4/He=0.1$, $CO_2/SiD_4=25$
  Temperature of the substrate: 200° C.
  Vacuum degree: 1.0 Torr
  RF electric power: 8 W
  Thickness of the layer: 150 Å a-Si:D layer 504
  Gas flow rate ratio: $SiD_4/He=0.1$
  Temperature of the substrate: 200° C.
  Vacuum degree: 1.0 Torr
  RF electric power: 20 W
  Thickness of the layer: 0.80 μm a-Si:O:D layer 505
  Gas flow rate ratios: $SiD_4/He=0.1$, $CO_2/SiD_4=5$
  Temperature of the substrate: 200° C.
  Vacuum degree: 1.0 Torr
  RF electric power: 8 W
  Thickness of the layer: 500 Å p+a-Si:O:D layer 506
  Gas flow rate ratios: $SiD_4/He=0.1$ $CO_2/SiD_4=5$, $B_2D_6/He=1\times10^{-3}$
  Temperature of the substrate: 200° C.
  Vacuum degree: 1.0 Torr
  RF electric power: 8 W
  Thickness of the layer: 200 Å

An ITO layer 507 having an area of 2 mm² and a thickness of 750 Å was formed on the amorphous silicon layer by a DC magnetron sputtering method, whereby a photosensor No. 3 according to the present invention was prepared.

EXAMPLE 4

Figure 10:
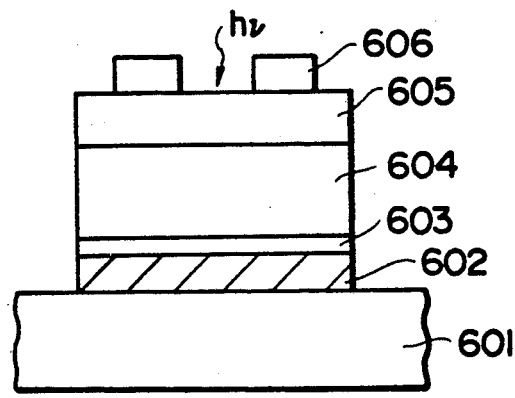

A cross-sectional view of the photosensor element according to the present invention prepared in the following s shown in FIG. 10.

A Cr thin layer 602 of 1,000 Å in thickness was formed on a substrate 601 made of Pyrex by vacuum evaporation. Thereafter, three amorphous silicon layers were successively overlaid on the substrate by a plasma CVD method under the following conditions.

a-Si:O:H layer 603
  Gas flow rate ratios: $SiH_4/H_2=0.2$, $NO_2/SiH_4=40$
  Temperature the substrate: 250° C.
  Vacuum degree: 1.0 Torr
  RF electric power: 8 W
  Thickness of the layer: 150 Å a-Si:H layer 604
  Gas flow rate ratio: $SiH_4/H_2=0.2$
  Temperature of the substrate: 250° C.
  Vacuum degree: 1.0 Torr
  RF electric power: 20 W
  Thickness of the layer: 0.5 μm a-Si:O:H layer 605
  Gas flow rate ratios: $SiH_4/H_2=0.2$, $NO_2/SiH_4=10$
  Temperature of the substrate: 250° C.
  Vacuum degree: 1.0 Torr
  RF electric power: 8 W
  Thickness of the layer: 500 Å

A SnO₂ layer 606 having an area of 2 mm² and a thickness of 750 Å was formed on the amorphous silicon layer 605 by vacuum evaporation using electron beams (O₂ introduced), whereby a photosensor No. 4 according to the present invention was prepared.

EXAMPLE 5

Figure 11:
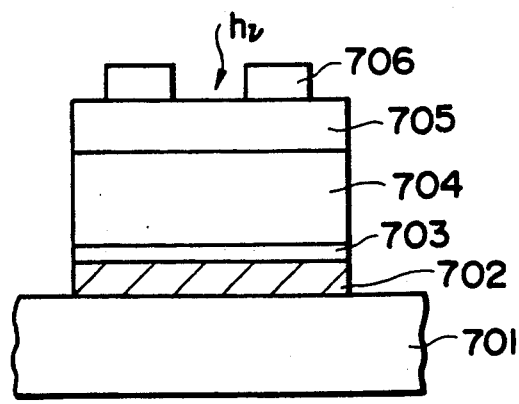

A cross-sectional view of the photosensor element according to the present invention prepared in the following manner is shown in FIG. 11.

A Cr thin layer 702 of 1,000 Å in thickness was formed on a substrate 701 made of Pyrex by a DC magnetron sputtering method. Thereafter, three amorphous silicon layers were successively overlaid on the substrate by a plasma CVD method under the following conditions.

n+a-Si:O:H layer 703
  Gas flow rate ratios: $SiH_4/H_2=0.2$, $PH_3/SiH_4=1\times10^{-4}$, $CO_2/SiH_4=25$
  Temperature of the substrate: 250° C.
  Vacuum degree: 1.0 Torr
  RF electric power: 8 W
  Thickness of the layer: 150 Å a-Si:H layer 704
  Gas flow rate ratio $SiH_4/H_2=0.2$
  Temperature of the substrate: 250° C.
  Vacuum degree: 1.0 Torr
  RF electric power: 20 W
  Thickness of the layer: 0.30 μm a-Si:O:H layer 705
  Gas flow rate ratios: $SiH_4/H_2=0.2$, $CO_2/SiH_4=5$
  Temperature of the substrate: 250° C.
  Vacuum degree: 1.0 Torr
  RF electric power: 8 W
  Thickness of the layer: 500 Å

An ITO layer 706 having an area of 2 mm² and a thickness of 750 Å was formed on the amorphous silicon layer 705 by a DC magnetron sputtering method, whereby a photosensor No. 5 according to the present invention was prepared.

EXAMPLE 6

Figure 12:
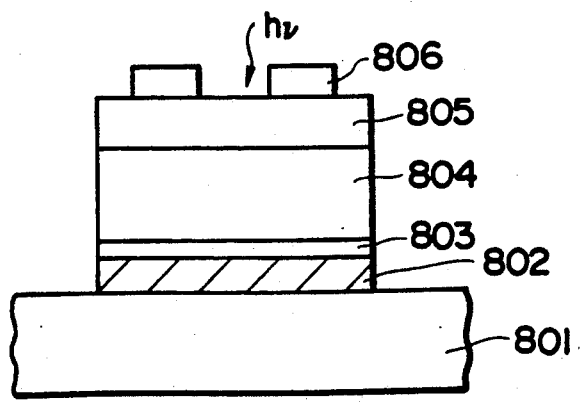

A cross-sectional view of the photosensor element according to the present invention prepared in the following manner is shown in FIG. 12.

A Cr thin layer 802 of 1,000 Å in thickness was formed on a substrate 801 made of Pyrex by vacuum evaporation. Thereafter, three amorphous silicon layers were successively overlaid on the substrate by a plasma CVD method under the following conditions.

a-Si:O:H layer 803
  Gas flow rate ratios: $SiH_4/H_2=0.2$, $CO_2/SiH_4=25$
  Temperature of the substrate: 250° C.
  Vacuum degree: 1.0 Torr
  RF electric power: 8 W
  Thickness of the layer: 150 Å a-Si:H layer 804
  Gas flow rate ratio: $SiH_4/H_2=0.2$,
  Temperature of the substrate: 250° C.

Vacuum degree: 1.0 Torr
RF electric power: 20 W
Thickness of the layer: 0.80 μm
p⁻-a-Si:O:H layer 805
  Gas flow rate ratios: $SiH_4/H_2=0.2$, $CO_2/SiH_4=5$, $B_2H_6/SiH_4=2\times10^{-5}$
  Temperature of the substrate: 250° C.
  Vacuum degree: 1.0 Torr
  RF electric power: 8 W
  Thickness of the layer: 500 Å

A $SnO_2$ layer 806 having an area of 2 mm² and thickness of 750 Å was formed on the amorphous silicon layer 805 by vacuum evaporation using electron beams ($O_2$ introduced), whereby a photosensor No. 6 according to the present invention was prepared.

EXAMPLE 7

Figure 13:
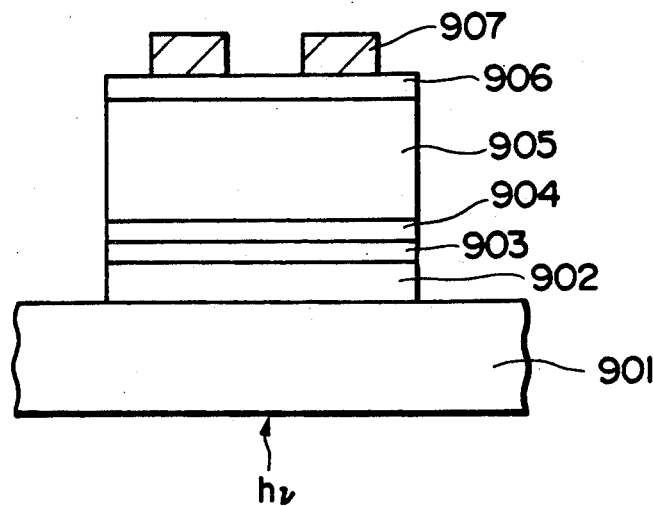

A cross-sectional view of the photosensor element according to the present invention prepared in the following manner is shown in FIG. 13.

An ITO layer 902 of 750 Å in thickness was formed on a substrate 901 made of Pyrex by a DC magnetron sputtering method. Thereafter, three amorphous silicon layers were successively overlaid on the substrate by a plasma CVD method under the following conditions. Note that the a-Si:O:H layer in contact with the ITO layer was diffused with In atoms contained in the ITO layer into a depth of approximately 400 Å at the interface between the a-Si:O:H layer and the ITO layer. The a-Si:O:H layer, therefore, became a state of p+a-Si:O:H.

p⁺-a-Si:O:H layer 903 and a-Si:O:H layer 904
  Gas flow rate ratios: $SiH_4/H_2=0.2$, $CO_2/SiH_4=5$
  Temperature of the substrate: 250° C.
  Vacuum degree: 1.0 Torr
  RF electric power: 8 W
  Total thickness of two layers: 600 Å
a-Si:H layer 905
  Gas flow rate ratio: $SiH_4/H_2=0.2$
  Temperature of the substrate: 250° C.
  Vacuum degree: 1.0 Torr
  RF electric power: 20 W
  Thickness of the layer: 0.80 μm
a-Si:O:H layer 906
  Gas flow rate ratios: $SiH_4/H_2=0.2$, $CO_2/SiH_4=25$
  Temperature of the substrate: 250° C.
  Vacuum degree: 1.0 Torr
  RF electric power: 8 W
  Thickness of the layer: 200 Å

An Al thin layer 907 having an area of 2 mm² and a thickness of 1.0 μm was formed on the amorphous silicon layer 906 by vacuum evaporation, whereby a photosensor No. 7 according to the present invention was prepared.

EVALUATIONE

The photosensors Nos. 1 to 7 prepared in Examples 1 to 7 were evaluated in terms of the Ip/Id ratio thereof.

The evaluation was made by using light source having a wavelength of 567 nm and an LED of 16 μW/cm² to which was applied a counter-bias voltage of 5 V. The results are shown in Table 1.

TABLE 1

| Photosensor | Ip/Id |
| --- | --- |
| No. 1 | $4.6 \times 10^3$ |
| No. 2 | $1.2 \times 10^4$ |
| No. 3 | $8.8 \times 10^4$ |
| No. 4 | $4.0 \times 10^3$ |

TABLE 1-continued

| Photosensor | Ip/Id |
| --- | --- |
| No. 5 | $1.4 \times 10^3$ |
| No. 6 | $9.6 \times 10^3$ |
| No. 7 | $1.8 \times 10^4$ |

The data shown in the above Table 1 demonstrate that all photosensors according to the present invention indicates high Ip/Id ratios.

Figure 14:
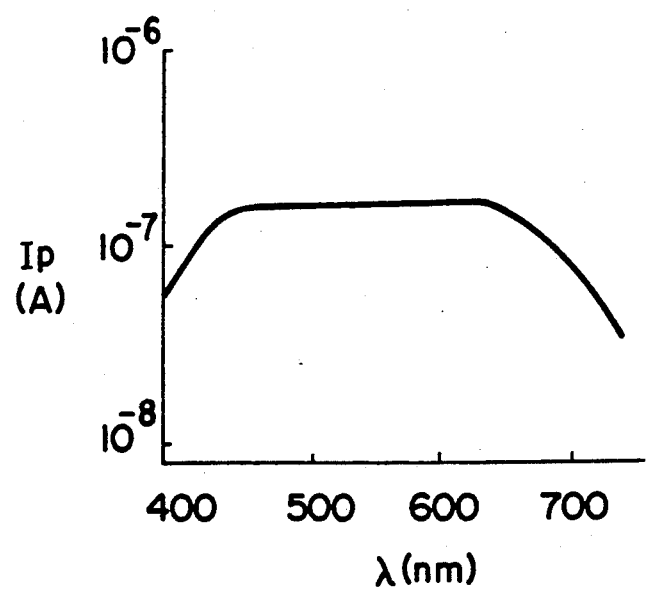
FIG. 14 is a graph showing the spectroscopic sensitivity of the photosensor prepared in Example 7.

The graph in FIG. 14 shows the spectroscopic sensitivity of the photosensor No. 7 prepared in Example 7, which indicated the best characteristics in the above evaluation. The spectroscopic sensitivity was measured by irradiating single-wave light having a wavelength of 400 to 730 nm and an LED of 16 μW/cm² under applying a counter-bias voltage of 5 V. As a result, it was found that the photosensor No. 7 was sensitive to light of shorter wavelength compared with conventional pin-type and MIS-type photosensors, and had a constant spectroscopic sensitivity in the range of 475 to 650 nm.

Further, a line sensor was prepared by using the photosensor No. 7. The line sensor in an A4-size with 8 lines/mm (1728 element) indicated the Ip/Id ratio of $1.5 \times 10^3$ when light of 567 nm and 16 μW/cm² was irradiated thereto. The dynamic characteristics of the line sensor were also evaluated by using a driving circuit of a storage type. As a result, the S/N ratio was 40 dB for 5 ms/line, and 25 dB for 1 ms/line.

The above results demonstrate that a line sensor having excellent static and dynamic characteristics can be prepared by employing the photosensor according to the present invention.

According to the present invention, the amorphous silicon photosensor comprising thin amorphous silicon layers, which indicates high Ip/Id ratio, has high uniformity, and is suitably applicable to a line sensor, can be obtained.

What is claimed is:

1. An amorphous silicon photosensor comprising a photoconductive layer which comprises three to four amorphous silicon layers formed on a substrate, each layer containing at least one kind of atom selected from the group consisting of hydrogen, heavy hydrogen, and halogen atoms, and having two heterojunctions, in which the optical band gap of an amorphous silicon layer laying between the two heterojunctions is in the range of 1.6 to 1.8 eV, a first end amorphous silicon layer, to which light is applied, contains oxygen, has an optical band gap of 1.9 eV or more, and at least part of the layer indicates an i-type or p-type conductivity, and a second end amorphous silicon layer, to which light is not applied, contains oxygen, having an optical band gap of 1.9 eV or more, and an electroconductivity ($\sigma d$) in the dark of $10^{-11}$ v.cm$^{-1}$ or less at 20° C. and at least part of the layer indicates an i-type or n-type conductivity.

2. The amorphous silicon photosensor as claimed in claim 1, wherein said amorphous silicon layer has an AM-1 conductivity/conductivity ratio $\sigma ph/\sigma d$ value of $10^3$ to $10^6$ at 20° C.

3. The amorphous silicon photosensor as claimed in claim 1, wherein said amorphous silicon layer has a thickness of 0.3 μm to 1.0 μm.

4. The amorphous silicon photosensor as claimed in claim 1, wherein said first end amorphous silicon layer has a $\sigma ph/\sigma d$ value of $10^3 \sim 10^6$ at 20° C.

5. The amorphous silicon photosensor as claimed in claim 1, wherein said first end amorphous silicon layer has an electroconductivity ($\sigma d$) of $10^{-11}$ v.cm$^{-1}$ or less at 20° C.

6. The amorphous silicon photosensor as claimed in claim 1, wherein said first end amorphous silicon layer has a thickness of 100 Å ~ 1000 Å.

7. The amorphous silicon photosensor as claimed in claim 1, wherein said second end amorphous silicon layer is a-Si:O:H layer.

8. The amorphous silicon photosensor as claimed in claim 1, wherein said second end amorphous silicon layer comprises amorphous silicon, oxygen and heavy hydrogen.

9. The amorphous silicon photosensor as claimed in claim 1, wherein said second end amorphous silicon layer has a thickness of 100 Å ~ 1000 Å.

* * * * *